DIRECT COUPLED CIRCUIT UTILIZING FIELD-EFFECT TRANSISTORS

Filed Sept. 7, 1962

INVENTOR.
GERALD E. THERIAULT
BY Eugene M. Whitacre
ATTORNEY

United States Patent Office 3,233,186

Patented Feb. 1, 1966

3,233,186

DIRECT COUPLED CIRCUIT UTILIZING FIELD-EFFECT TRANSISTORS

Gerald E. Theriault, Hopewell, N.J., assignor to Radio Corporation of America, a corporation of Delaware Filed Sept. 7, 1962, Ser. No. 222,129
6 Claims. (Cl. 330—19)

This invention relates to electrical signal amplifier circuits, and more particularly to amplifier circuits of the type including semiconductor devices as the active circuit elements thereof.

In vacuum tube or semiconductor amplifying circuits which provide linear amplification of an applied signal, at least two conditions must be met. First, the input impedance of the amplifier must remain substantially constant over the entire applied signal swing, and second, the amplifier must be biased to a point on its operating characteristic such that substantially linear amplification of the applied signal may occur.

In vacuum tube amplifiers, if the control grid is driven positive relative to the cathode, distortion occurs because the grid conducts current, thereby greatly reducing the input impedance of the tube. To overcome this problem, the control grid of vacuum tube amplifiers is (1) biased negatively relative to the cathode, and (2) the amount of negative bias is such that the operating point of the tube is in the linear operating region of the tube characteristic. In transistor amplifier circuits, if the base electrode becomes reverse biased relative to the emitter electrode, distortion occurs because the base electrode ceases to draw current, thereby greatly increasing the input impedance of the transistor. Biasing circuit means are required to provide a forward base-to-emitter voltage of a magnitude such that the transistor operates in a linear portion of its characteristic.

Vacuum tube amplifiers may be self-biased by contact potential. Alternatively, a cathode or emitter resistor, which if not bypassed is degenerative to the applied signal, or a suitable voltage divider, may be used to provide the biasing potential for either transistors or tubes. In addition to drawing power supply current, voltage dividers may load the circuit coupled to the input electrode of the tube or transistor thereby undesirably affecting the efficiency of signal transfer. In any case, in the no signal condition, known types of tube or transistor amplifier circuits are characterized by the fact that a D.C. voltage exists betwen the input and common electrodes to provide proper biasing.

It is an object of this invention to provide an improved electrical signal amplifier circuit.

Another object of this invention is to provide an improved electrical signal amplifier circuit including a semiconductor device as the active circuit element thereof which does not require biasing means, and which is effective to provide substantially linear amplification when zero D.C. voltage exists between the input and common electrodes as measured during the absence of input signals.

It is a further object of this invention to provide an improved direct coupled amplifier.

Still another object of this invention is to provide an improved and simplified cascade connected direct coupled amplifier of simple construction and capable of translating relatively large signal levels.

Circuits embodying the invention include an insulated gate field effect transistor, exemplified by an MOS (metal-oxide-semiconductor) transistor, the structure and characteristics of which will be described hereinafter. An insulated gate field effect transistor includes gate, source, and drain electrodes, and is processed in a manner to exhibit a family of drain current vs. drain voltage curves for different values of gate-to-source bias voltages, wherein the curve representative of zero bias between the gate and source electrodes is in a substantially linear operating region for the transistor. An input circuit connected between the gate and source electrodes provides a direct current path therebetween, and an output circuit is connected to the drain electrode. No biasing circuit means are required, and no measurable direct voltage appears between the source and gate electrodes under no signal conditions.

The amplifier is less complicated than circuitry known heretofore in the sense that fewer physical components are required. In addition, the absence of loading or degeneration caused by biasing circuit means reduces power supply requirements. Still further, amplifier circuits embodying the invention are particularly well adapted for operation from a high impedance signal source such as a piezoelectric phonograph pickup or a diode detector circuit, and the efficiencies are such as to permit the design and construction of amplifier, radio or like systems with fewer stages of amplification.

The novel features which are considered characteristic of this invention are set forth with particularity in the appended claims. The invention itself, however, both as to its organization and method of operation as well as additional objects and advantages thereof will best be understood from the accompanying drawing in which:

Figure 1:
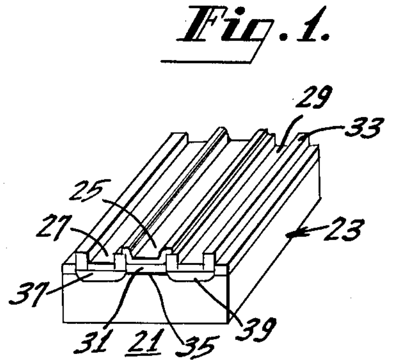
FIGURE 1 is a diagrammatic view of a field effect transistor suitable for use in circuits embodying the invention.

Referring now to the drawings and particularly to FIGURE 1, a field effect transistor 21 which may be used with circuits embodying the invention includes a base or body 23 of semiconductor material. The base 23 may be either a single crystal or polycrystalline and may be of any one of the semiconductor materials used to prepare transistors in the semiconductor art. The transistor includes a conductive gate electrode 25, and a pair of electrodes 27 and 29 which may be interchangeably used as the source and drain electrodes. The gate electrode is separated from the body of semiconductor material by an insulating oxide layer 31.

The transistor of FIGURE 1 may be prepared by processing the device in the following manner. A single crystal body of P-type silicon of relatively high resistivity such as 500 ohm-cm. has at least one surface cleaned to expose the body material. This may be achieved, for example, by etching the surface of the body with a chemical etchant to remove all of the disturbed material on the surface. Heavily doped silicon dioxide is then deposited by any suitable means as a layer portion 33 on selected areas of the clean surface on the body 23. For example, a uniform layer of doped silicon may be deposited on the crystal body 23 and the portion of the deposited layer overlaying the location where the insulating layer 31 is to be formed, is then removed. The deposited oxide may be removed by any suitable manner such as by a photoresist and acid etching technique. The thickness of the deposited oxide layer 33 is preferably between 1 and 5 microns.

The deposited silicon dioxide layer 33 contains a relatively high concentration of impurities (also referred to as dopant) which are N-type when present in silicon. Such impurities may for example be antimony, arsenic or phosphorous.

The body 23 is then placed in a furnace and heated to 900 to 1100° C. in a dry oxygen atmosphere and cooled. During the heating, the exposed surface portion of the silicon body 23 (under the later applied gate electrode 25) is converted to silicon dioxide. Such converted material is referred to as thermally grown silicon dioxide and comprises the oxide layer 31 as shown in the drawings. The converted material 31 is essentially pure silicon dioxide and has a high resistivity on the order of $10^{18}$ ohms-cm. A conducting channel 35 of N-type material forms at the interface between the oxide layer 31 and the silicon body 23.

During the same heating step, impurities from the deposited silicon dioxide layers 33 diffuse into the silicon as indicated at 37 and 39. The regions 37 and 39 are of low resistivity and provide a low resistance connection to the conducting channel 35.

Portions of the deposited oxide layer 33 are then removed to permit access to the diffused regions 37 and 39. Conductive electrodes such as aluminum are then selectively deposited on the diffused regions 37 and 39 to form the source and drain electrodes 27 and 29, and on the insulating layer 31 to form the gate to electrode 25. The gate electrode 25 may be coextensive with the layer 31 of grown silicon dioxide. However this coextensive formation presents many fabrication difficulties especially in aligning the gate electrode 25 over the layer of converted body material 31. To simplify the fabrication, the gate electrode 25 may be made to extend over parts of the deposited oxide portions 33 and covers the entire layer 31 of grown silicon dioxide material and parts of the adjacent deposited oxide layer portions 33. Since the thickness of the deposited oxide layer 33 is at least four times that of the layer 31 of thermally grown silicon dioxide, only a small amount of additional capacitance between the gate 25 and the body 23 is added to the device.

In the embodiment, described, the channel 35 is about .0005 inch in dimension between the diffused areas 37 and 39 and is about .05 inch transversely thereto. The high resistivity layer 31 of silicon dioxide is about 2700 A. thick. Such a device has an input resistance of about $10^{14}$ ohms, as measured between the source and gate electrodes.

Figure 2:
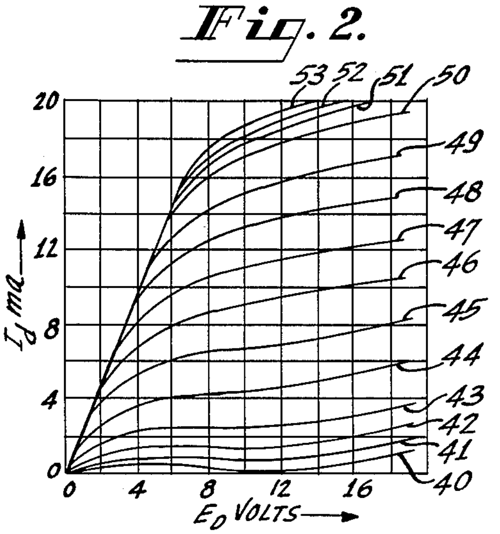
FIGURE 2 is a graph showing family of drain current vs. drain voltage, curves for various values of gate-to-source voltages for the transistor of FIGURE 1.

FIGURE 2 is a family of curves 40–53 illustrating the drain current vs. drain voltage characteristic of the transistor of FIGURE 1 for different values of gate-to-source voltage. It will be noted that the curves 50–53 reprsentative of high drain current and the curves 40–43 representative of relatively low drain current are relatively closely spaced, whereas the intermediate curves 43–50 are relatively uniformly spaced. The equal spacing of the curves for equal gate-to-source voltage increments is indicative of a linear operating region for the transistor. A feature of an insulated-gate field effect transistor is that the zero bias characteristic can be at any one of the curves 40–53 shown in FIGURE 2 with the curves above the zero bias curve representing positive gate voltages relative to the source and the curves below the zero bias point representing negative gate voltages relative to the source.

The location of the zero bias curve can be selected by control of the processing of the transistor during its manufacture. For example by controlling the time and/or temperature of the step of the process when the silicon dioxide layer 31 is grown, the number of free charge carriers in the device can be controlled. The longer the transistor is baked, and the higher the temperature, in a dry oxygen atmosphere, the more the drain current for a given amount of drain voltage for zero bias between the source and gate electrodes. By way of example, to establish the curve 47 as the zero bias curve, during the step which produces the silicon dioxide layer 31, the transistor was baked for two hours at 900° centigrade in an atmosphere of dry oxygen. If the temperature, or time of baking, or both are increased, the zero bias curve will correspond to one of the curves 48–53. By decreasing the temperature or time, or both, in the baking cycle the zero bias curve will occur for lower values of drain current such as for example one of the curves 40–46.

Figure 3:
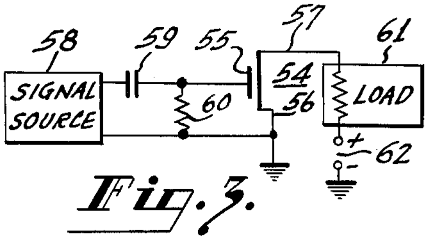
FIGURE 3 is a schematic circuit diagram, partly in block form, of an amplifier circuit embodying the invention.

Reference is now made to the schematic circuit diagram of FIGURE 3 which includes an MOS transistor 54 having a gate electrode 55, a source electrode 56 and a drain electrode 57. The transistor 54 is selected to be of a type having a family of drain current vs. drain voltage curves for different values of gate-to-source voltages wherein the curve representative of zero bias between the gate and source electrodes is in a substantially linear operating region for the transistor. By way of example, the curve 47 of FIGURE 2 represents the drain current vs. drain voltage characteristic with zero D.C. bias voltage between the gate and source electrodes. The curves 48–43 represent corresponding characteristics as the gate is made positive with respect to the source electrode in one volt increments, and the curves 46–40 represent the characteristics as the gate is made negative in one volt increments relative to the source. In other words the curve 48 represents plus one volt, 49 represents plus two volts, the curve 50 represents plus three volts; the curve 46 represents minus one volt, the curve 45 represents minus two volts, etc. (all voltages measured at the gate electrode relative to the source).

A suitable signal source 58 is coupled through a capacitor 59 to the gate electrode 55 of the transistor 54. A resistor 60 included in the transistor input circuit provides a direct current path between the gate electrode 55 and the source electrode 56 of the transistor. The load for the transistor 54 comprises any suitable utilization means 61 which provides a direct current connection from the drain electrode 57 of the transistor 54 to the positive terminal of an operating potential supply source 62.

It will be noted that the source electrode 56 is connected to a point of fixed potential, shown as ground. Under the condition when no signal is applied by the signal source 58, zero D.C. voltage exists between the source electrode 56 and gate electrode 55.

The zero gate-to-source bias curve for the transistor 54 corresponds to the curve 47 of FIGURE 2. Thus for excursions of applied signals from the signal source 58 in the positive direction the drain current increases by a given amount, which is substantially linearly related to the change of gate-to-source voltage. In like manner, when the signal excursion is in the negative direction, the drain current is reduced by an amount which is substantially linearly related to the change in gate-to-source voltage. If the signal excursion is large enough to drive the gate-to-source voltage to the curves 40 and 53, which corresponds to nonlinear portions of the transistor operating characteristic, distortion will occur. From the foregoing, it can be seen that an amplifier circuit embodying the invention is of extremely simple construction and need not include separate biasing circuit means to provide linear amplification.

Figure 4:
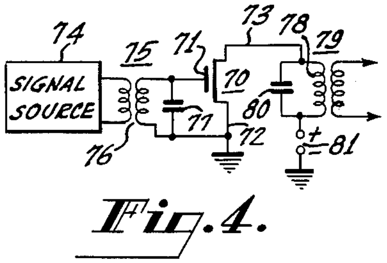
FIGURE 4 is a schematic circuit diagram partly in block form of tuned high frequency amplifier embodying the invention.

The advantages of circuits embodying the invention is emphasized by the simplicity of a tuned high frequency amplifier such as an intermediate frequency amplifier shown in FIGURE 4. The amplifier includes an MOS transistor 70 of the same general characteristics as the transistor used in the circuit of FIGURE 3, and which has a gate electrode 71, a source electrode 72 and a drain electrode 73. A suitable signal source 74 is coupled to the amplifier through an intermediate frequency transformer 75 which includes a secondary winding 76 tuned to the intermediate frequency by a capacitor 77. One terminal of the secondary winding 76 is connected to the gate electrode 71 and the other terminal thereof is connected to the source electrode 72 and to ground. The output circuit for the intermediate frequency amplifier comprises the primary winding 78 of an intermediate frequency transformer 77. The primary winding 78, which is tuned to the intermediate frequency by a capacitor 80, couples the drain electrode 73 to the positive terminal of an operating potential supply 81.

In the circuits of FIGURE 4 it can be seen that the gate electrode 71 and source electrode 72 are maintained at the same D.C. potential by the low impedance of the secondary winding 76. The fact that the transistor presents a high input impedance for both positive and negative input signal variations and the fact that the zero bias operating point of the transistor is in the linear portion of the transistor operating characteristic enables linear signal amplification.

Figure 5:
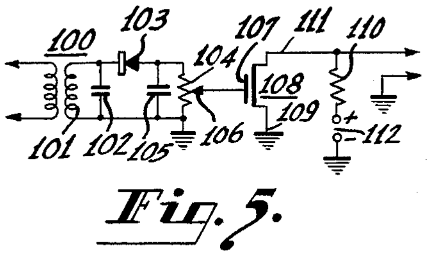
FIGURE 5 is a schematic circuit diagram of an amplifier circuit embodying the invention direct coupled to a diode detector circuit of a signal receiver.

FIGURE 5 illustrates another embodiment of the invention showng an MOS transistor directly coupled to the second detector stage of a signal receiver such as a broadcast or television receiver. A modulated carrier wave from a suitable source, not shown, is applied to the primary winding of a coupling transformer 100. The secondary winding 101 of coupling transformer 100 is tuned by a capacitor 102 to the frequency of the waves from the source, which may for example be the receiver intermediate frequency. A rectifier 103 is connected in series with the combination of a variable resistor 104 and shunt I-F bypass capacitor 105 across the terminals of the secondary winding 101.

Modulated carrier waves developed across the secondary winding 101 are detected by the diode 103, and detected signals corresponding to the modulation components of the carrier waves are developed across the variable resistor 104. The variable resistor 104 includes an adjustable tap 106 which is directly connected to the gate electrode 107 of an MOS transistor 108. The source electrode 109 of the transistor is connected through ground to the junction of the variable resistor 104 with the secondary winding 101. A load resistor 110 connects the drain electrode 111 to the positive terminal of an operating potential supply source 112. Signals developed across the resistor 110 are coupled to suitable utilization means which may, if desired, comprise additional stages of amplification. If desired, an automatic gain control voltage may be derived from the resistor 104, or an amplified automatic gain control may be derived from the resistor 110.

In the circuit of FIGURE 5 the MOS transistor 108 is selected to have a zero bias characteristic which corresponds to the curve 49, of FIGURE 2. It will be seen that for low levels of applied signal, the transistor 108, operating about the curve 49, will provide substantially linear operation. However as the signal level increases, a D.C. component corresponding to the average signal level will be developed across the resistor 104 causing the gate electrode 107 to be driven in the negative direction. This action moves the bias point to the transistor 108 toward the center of its linear operating range, and the circuit is designed so that the transistor operates on the curve 47 for maximum expected negative D.C. voltage applied between the gate and source electrodes of the transistor, to maximize the signal amplitude which may be linearly amplified. Since the input resistance of the MOS transistor is high, on the order of $10^{14}$ ohms, a high resistance (5 to 10 megohms) variable resistor 104 may be used. This magnitude of resistance provides better impedance matching than can be effected in currently used junction transistor circuits, thereby avoiding excessive signal loss, and eliminating the need for as much I-F amplification as is required in presently used transistor receivers. The improvement is sufficiently great that it is possible to reduce the number of stages of I-F amplification in a receiver while maintaining about the same performance characteristics.

Figure 6:
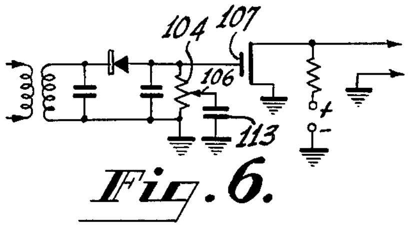
FIGURE 6 is a modification of the circuit shown in FIGURE 5.

The schematic circuit diagram of FIGURE 6 shows a modification of the circuit of FIGURE 5, the only difference being in the manner in which volume controlling action is effected. In the circuit of FIGURE 6 the high signal potential side of the resistor 104 is permanently connected to the gate electrode 107 and the volume is controlled by shunting variable amounts of audio signal voltage to ground by a capacitor 113 which is connected between the variable tap 106 of the resistor 104 and signal ground. As in the circuits of FIGURES 5 and 6, zero D.C. bias exists between the source and gate electrodes under the no signal condition.

Figure 7:
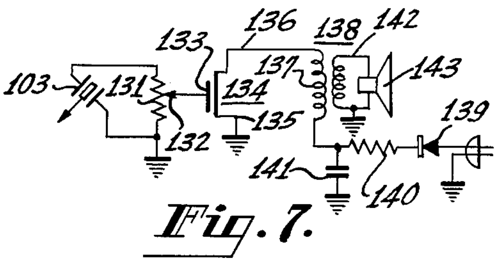
FIGURE 7 is a schematic circuit diagram of a single stage phonograph amplifier circuit embodying the invention; and, FIGURE 8 is a schematic circuit diagram of a cascade connected D.C. amplifier illustrating another embodiment of the invention.

Another embodiment of the invention comprises a single stage phonograph amplifier as shown in the schematic circuit diagram of FIGURE 7. The particular phonograph amplifier shown is adapted to be operated from the usual alternating current mains. A piezoelectric pickup device 130 exhibiting high impedance is connected across a variable resistor 131 which may for example comprise 10 megohm volume controlling potentiometer. A variable tap 132 of the resistor 131 is directly connected to the gate electrode 133 of an MOS transistor 134. The transistor 134, may for example be of the type used in the circuit of FIGURE 3. The source electrode 135 of the transistor is connected through ground of the low signal potential side of the variable resistor 131. The drain electrode 136 is coupled through the primary winding 137 of an output transformer 138 to the power supply circuit. Direct current operating voltage for the amplifier is derived in a known manner using a rectifier device 139 and a resistance-capacitance filter comprising a series resistor 140 and shunt capacitor 141. The rectifier is poled so that a positive voltage is developed for application to the drain electrode 136 of the transistor. The secondary winding 142 of the transformer 138 is coupled to suitable utilization means such as a sound reproducer 143.

As described above in connection with FIGURES 3 and 4, the transistor 134 is selected to have a characteristic such that at zero bias the amplifier can provide linear amplification. In this manner no additional biasing network means is required. It may be noted that the extremely high input resistance of the transistor 134 provides a substantial impedance match with the signal source or piezoelectric pickup 130 so that efficient power transfer between the pickup and the amplifier stage may be obtained. Furthermore since no biasing is required there is no loading on the input circuit or unnecessary power supply drain by a voltage divider network as is commonly used in known types of transistor amplifiers. Still further, there is no requirement for a source resistor to provide biasing, which must be bypassed by a relatively large value of capacitance to prevent signal degeneration.

Figure 8:
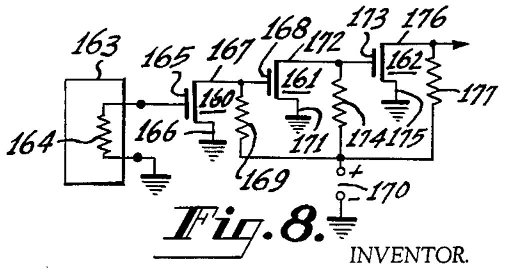

FIGURE 8 is a schematic circuit diagram of a direct coupled transistor amplifier illustrating another aspect of the invention. The direct coupled amplifier of FIGURE 8 includes three MOS transistors 160, 161 and 162. Signals from a suitable source 163, which includes a direct current path 164, are applied between the gate electrode 165 and source electrode 166 of the transistor 160. The drain electrode 167 of the transistor 160 is directly coupled to the gate electrode 168 of the transistor 161, and through a resistor 169 to the positive terminal of the operating potential supply source 170. The source electrode 171 of the transistor 161 is grounded, and its drain electrode 172 is directly connected to the gate electrode 173 of the transistor 162. A load resistor 174 connects the drain electrode 172 to the positive terminal of the operating supply source. In like manner the source electrode 175 of the transistor 162 is grounded and the drain electrode 176 thereof is connected through a load resistor 177 to the positive operating potential supply source terminal.

The transistor 160 is selected so that its zero bias curve corresponds to the curve 47 of FIGURE 2. Thus under no signal conditions, no D.C. voltage is present between the gate electrode 165 and the source electrode 166. When signals are applied from the source 163 they are linearly amplified by the transistor 160 and developed across the load resistor 169. The drain 167 current through the resistor 169 produces a positive voltage at the gate electrode 168 under quiescent, or no signal conditions. Assuming the positive voltage at the gate electrode 168 to be ±4 volts, the transistor 161 is selected to have a zero bias characteristic corresponding to the curve 43 of FIGURE 2. The positive voltage developed across the load resistor 169 thus brings the operating point of the transistor 162 to the drain current curve 47, thereby enabling linear signal amplification by the transistor 161 with the amplified signals being developed across the load resistor 174. In like manner a positive D.C. voltage is developed across the load resistor 174 in the no signal condition and is applied to the gate electrode 173 of the transistor 162. Accordingly the transistor 162 is also selected to have a drain characteristic corresponding to the curve 43 of FIGURE 2 or such other characteristic such that the positive voltage developed by the resistor 174 brings the operating point of the transistor 162 approximately to the center of the linear region of its operating characteristic.

What is claimed is:

1. A direct coupled amplifier comprising in combination,
   a first field effect transistor including gate, source and drain electrodes and characterized by a family of drain current versus drain voltage curves for values of gate-to-source bias voltages wherein the curve representative of zero bias between said gate and source electrodes is in a substantially linear operating region for said transistor,
   means providing a signal source direct current conductively connected between said gate and source electrodes of said first transistor,
   a source of operating potential,
   a load resistor connected in series with said source of operating potential between the drain electrode and said source electrodes of said first transistor,
   a second field effect transistor including gate, source and drain electrodes and characterized by a family of drain current versus drain voltage curves for different values of gate-to-source bias voltages wherein the curve representing a positive bias that substantially corresponds to said zero bias curve of said first transistor, whereby the value of a positive voltage appearing at the drain electrode of said first transistor corresponds to gate-to-source bias curve in the substantially linear operating region of said second transistor,
   means directly connecting the gate electrode of said second transistor with the drain electrode of said first transistor,
   means directly connecting the source electrodes of said first and second transistors, and
   a load resistor connected in series with said source of operating potential between the drain and source electrodes of said second transistor.

2. An electrical circuit comprising:
   a first insulated-gate field-effect transistor having gate, source, and drain electrodes and exhibiting a drain current versus drain voltage characteristic for zero gate-to-source bias voltage in a linear operating region for said first transistor,
   a second insulated-gate field-effect transistor having gate, source and drain electrodes and exhibiting a second drain current versus drain voltage characteristic having a linear operating region for a gate-to-source bias voltage corresponding to a first voltage, said first voltage bias characteristic of said second transistor substantially corresponding to said zero gate-to-source bias voltage characteristic of said first transistor,
   circuit means interconnecting said first and second insulated-gate field-effect transistors as cascade direct coupled amplifiers with the drain-to-source current path of said first transistor directly coupled between the gate and source electrodes of said second transistor and with a quiescent voltage between the source and drain electrodes of said first transistor corresponding to a gate-to-source bias voltage in the linear operating range of said second transistor.

3. An electrical circuit comprising:
   means providing a source of signals having a first direct voltage component,
   a first insulated-gate field-effect transistor having gate, source, and drain electrodes and exhibiting a first drain current versus drain voltage characteristic in a linear operating region for a gate-to-source bias voltage corresponding to said first direct voltage component,
   means coupling said source of signals to apply said first direct current component between the gate and source electrodes of said first transistor,
   a source of operating potential and a first load impedance element connected in series between the source and drain electrodes of said first transistor for developing said signals with a second direct voltage component substantially different from said first direct voltage component at the drain electrode of said first transistor,
   a second insulated-gate field-effect transistor having gate, source and drain electrodes and exhibiting a drain current versus drain voltage characteristic in a linear operating region for a gate-to-source bias voltage corresponding to a third direct voltage component substantially different from said first direct voltage component,
   means coupling said first and second transistors to apply said signals and said second direct voltage component developed at the drain electrode of said first transistor between the gate and source electrodes of said second transistor whereby said second transistor operates in its linear operating region, and
   means including said source of operating potential and a second load impedance element connected between the source and drain electrodes of said second transistor.

4. An electrical circuit comprising:
   a first insulated-gate field-effect transistor having gate, source and drain electrodes and exhibiting a first drain current versus drain voltage characteristic for zero gate-to-source bias voltage,
   a second insulated-gate field-effect transistor having gate, source and drain electrodes and exhibiting a second and different drain current versus drain voltage characteristic for zero gate-to-source bias voltage,
   first circuit means including an operating potential supply and a load impedance element connected in series between the source and drain electrodes of said first transistor, and
   second circuit means direct current conductively connecting said load impedance element between the gate and source electrodes of said second transistor.

5. An electrical circuit comprising:
   a first insulated-gate field-effect transistor having gate, source and drain electrodes and exhibiting a first drain current versus drain voltage characteristic for zero gate-to-source bias voltage,
   a second insulated-gate field-effect transistor having gate, source and drain electrodes and exhibiting a drain current versus drain voltage characteristic for zero gate-to-source bias voltage characterized by substantially less drain current for a zero gate-to-source voltage than said first insulated-gate field-effect transistor, first circuit means including an operating potential supply and a load impedance element connected in series between the source and drain electrodes of said first transistor, and second circuit means direct current conductively connecting said load impedance element between the gate and source electrodes of said second transistor.

6. A direct coupled amplifier comprising in combination:

a first insulated-gate field-effect transistor having gate, source and drain electrodes and exhibiting a first drain current versus drain voltage characteristic for zero gate-to-source bias voltage, a second insulated-gate field-effect transistor having gate, source and drain electrodes and exhibiting a drain current versus drain voltage characteristic for zero gate-to-source bias voltage in which substantially less drain current flows for a given source-to-drain voltage than flows in said first transistor for the same source-to-drain voltage, first circuit means including an operating potential supply and a direct current conductive load impedance element connected in series between the source and drain electrodes of said first transistor, and means for applying the direct voltage developed across said impedance element between the gate and source electrodes of said second transistor for biasing said second transistor to a linear portion of its operating characteristic.

References Cited by the Examiner

UNITED STATES PATENTS

| | | | |
|---|---|---|---|
| 2,762,875 | 9/1956 | Fischer | 330—21 X |
| 2,790,856 | 4/1957 | Birkenes | 330—21 |
| 2,822,430 | 2/1958 | Lin | 330—31 X |
| 2,997,578 | 8/1961 | Englund | 307—88.5 |
| 3,030,586 | 4/1962 | Paz et al. | 330—19 |
| 3,056,888 | 10/1962 | Atalla. | |
| 3,135,926 | 6/1964 | Bockemuehl | 330—38 |

FOREIGN PATENTS

| | | |
|---|---|---|
| 1,257,194 | 2/1961 | France. |

OTHER REFERENCES

Angelo, Text, Electronic Circuits, McGraw-Hill Book Co., Inc., 1958, page 14.

Huang et al., Field Effect Transistor Circuit Design, pages 42–45, Electronic Design, October 1955.

Weimer, The TFT—A New Thin-Film Transistor, Proceedings of the IRE, Aug. 23, 1962, pages 1462–1469.

ROY LAKE, *Primary Examiner.*

NATHAN KAUFMAN, *Examiner.*